United States Patent
Duemler et al.

(10) Patent No.: US 11,218,120 B2
(45) Date of Patent: Jan. 4, 2022

(54) PROGRAMMABLE AMPLIFIERS

(71) Applicant: Integrated Device Technology, Inc., San Jose, CA (US)

(72) Inventors: Ulrich Duemler, Zurich (CH); Domenico Pepe, Zurich (CH)

(73) Assignee: Integrated Device Technology, Inc., San Jose, CA (US)

(*) Notice: Subject to any disclaimer, the term of this patent is extended or adjusted under 35 U.S.C. 154(b) by 97 days.

(21) Appl. No.: 16/419,475

(22) Filed: May 22, 2019

(65) Prior Publication Data

US 2020/0373889 A1    Nov. 26, 2020

(51) Int. Cl.
| | |
|---|---|
| *H03F 3/45* | (2006.01) |
| *H03F 1/42* | (2006.01) |
| *H03F 3/68* | (2006.01) |
| *H03F 1/22* | (2006.01) |

(52) U.S. Cl.
CPC .............. *H03F 1/42* (2013.01); *H03F 1/22* (2013.01); *H03F 3/45085* (2013.01); *H03F 3/68* (2013.01); *H03F 2200/213* (2013.01); *H03F 2200/451* (2013.01); *H03F 2203/45298* (2013.01); *H03F 2203/45396* (2013.01)

(58) Field of Classification Search
CPC .......... H03F 1/42; H03F 1/22; H03F 3/45085; H03F 3/68; H03F 2203/45298; H03F 2203/45396; H03F 2200/451; H03F 2200/213; H03F 3/45183; H03F 3/45179; H03F 3/45192; H03F 3/08; H03F 3/087; H03F 3/082; H03F 3/211; H03F 3/602; H03F 3/604; H03G 1/0023; H03G 1/0088

USPC ............... 330/124 R, 253, 254, 295, 308
See application file for complete search history.

(56) References Cited

U.S. PATENT DOCUMENTS

| | | | |
|---|---|---|---|
| 4,596,958 A | 6/1986 | Graeme et al. | |
| 5,880,631 A | 3/1999 | Sahota | |
| 5,987,313 A * | 11/1999 | Lee | H03J 1/0033 455/186.1 |
| 6,353,366 B1 | 3/2002 | Chan et al. | |
| 6,392,487 B1 * | 5/2002 | Alexanian | H03G 1/0023 330/254 |

(Continued)

OTHER PUBLICATIONS

"LTC6910: Digitally Controlled Programmable Gain Amplifiers in SOT-23 Data Sheet," Analog Devices, Dec. 2002, pp. 1-26. https://www.analog.com/media/en/technical-documentation/data-sheets/6910fb.pdf.

(Continued)

*Primary Examiner* — Khanh V Nguyen
(74) *Attorney, Agent, or Firm* — Haynes and Boone, LLP

(57) ABSTRACT

A programmable transimpedance amplifier (TIA) includes a plurality of signal paths between an output of a common emitter amplifier and the output of the TIA. The TIA is programmed by selecting one of the signal paths, because the paths have different parameters (e.g. different bandwidth). Thus, the bandwidth or other parameter can be programmed by selecting the appropriate path. The common emitter amplifier's output is coupled to the inputs of common base amplifiers in each path. The inputs have low impedance. Also, each path has a separate buffer amplifying the common base amplifier output in the path. Therefore, having multiple paths does not significantly degrade the amplifier performance. High bandwidth can be provided.

20 Claims, 2 Drawing Sheets

(56) References Cited

U.S. PATENT DOCUMENTS

| | | | | |
|---|---|---|---|---|
| 6,658,217 | B2* | 12/2003 | Ohhata | H04B 10/6932 |
| | | | | 250/214 A |
| 6,690,236 | B2* | 2/2004 | Saito | H03F 3/45103 |
| | | | | 327/359 |
| 6,791,414 | B2* | 9/2004 | Trodd | H03G 1/0023 |
| | | | | 330/254 |
| 6,933,984 | B2* | 8/2005 | Yamamoto | H03J 3/06 |
| | | | | 348/731 |
| 6,972,624 | B1 | 12/2005 | Stroet | |
| 7,102,435 | B2* | 9/2006 | Bosch | H03G 1/0023 |
| | | | | 327/359 |
| 7,260,377 | B2 | 8/2007 | Burns et al. | |
| 7,372,330 | B2* | 5/2008 | Yoshizawa | H03F 1/26 |
| | | | | 330/253 |
| 7,482,879 | B2* | 1/2009 | Koutani | H01L 27/0207 |
| | | | | 330/254 |
| 9,143,111 | B2* | 9/2015 | Yoshikawa | H03G 3/3036 |
| 10,367,466 | B2* | 7/2019 | Taghizadeh Ansari | |
| | | | | H03G 3/3036 |
| 10,608,599 | B2* | 3/2020 | Sugimoto | H03G 1/0023 |
| 10,644,805 | B2* | 5/2020 | Vera Villarroel | H03F 3/087 |
| 10,924,075 | B2* | 2/2021 | Muralidharan | H03F 1/3241 |
| 10,958,230 | B2* | 3/2021 | Vera Villarroel | H03F 3/08 |
| 2003/0020547 | A1 | 1/2003 | Feng | |
| 2016/0142233 | A1 | 5/2016 | Mobin et al. | |
| 2018/0102749 | A1 | 4/2018 | Heydari et al. | |

OTHER PUBLICATIONS

Calvo, "A 2.5 GHz Optoelectronic Amplifier in 0.18 µm CMOS," Worcester Polytechnic Institute, May 2003, pp. 1-111. https://web.wpi.edu/Pubs/ETD/Available/etd-0424103-110517/unrestricted/CCalvo.pdf.

JHA, "Design of a Complementary Silicon-Germanium Variable Gain Amplifier," Georgia Institute of Technology, Aug. 2008, pp. 1-80. https://smartech.gatech.edu/bitstream/handle/1853/24614/jha_nand_k_200808_ms.pdf.

Yu, "Design of a High Dynamic Range CMOS Variable Gain Amplifier for Wireless Sensor Networks," University of Arkansas, May 2012, pp. 1-86. https://scholarworks.uark.edu/etd/250.

* cited by examiner

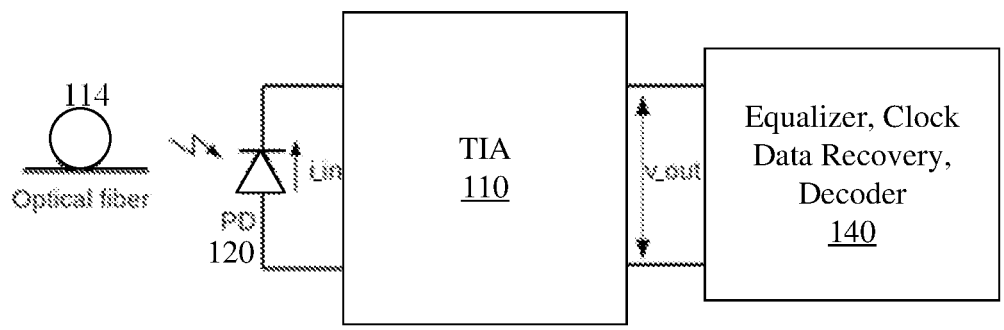
FIG. 1
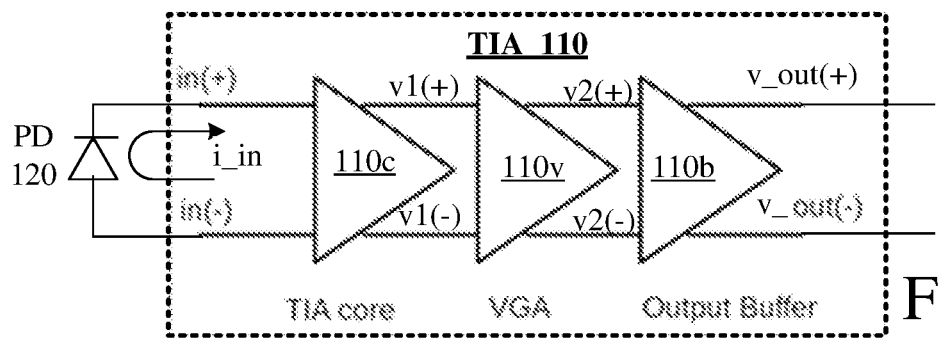
FIG. 2
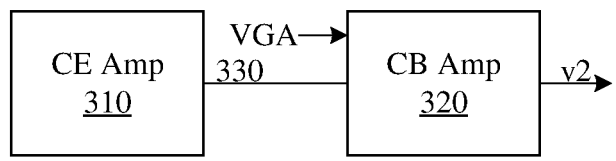
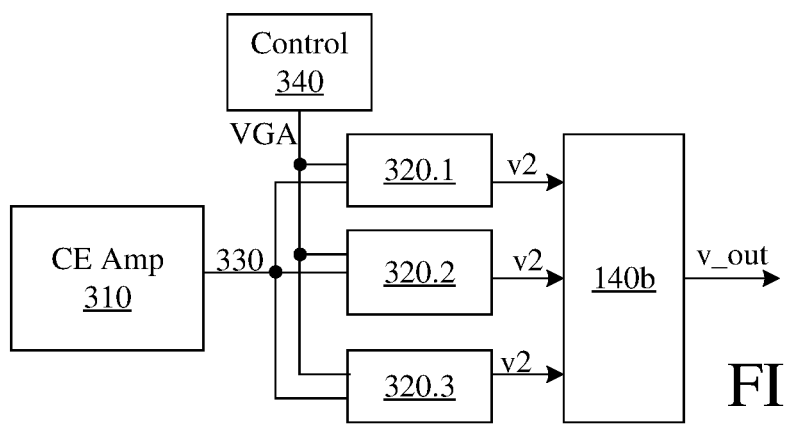
FIG. 3A
FIG. 3B

PROGRAMMABLE AMPLIFIERS

BACKGROUND OF THE INVENTION

The present invention relates to amplifiers.

Amplifiers are widely used in electric circuits. FIG. 1 illustrates a transimpedance amplifier (TIA) 110 in a receiver of an optical communication system. The optical signal arrives via an optical fiber cable 114 at a photodetector (PD) 120. The photodetector produces a small current i_in in response. TIA 110 converts this current into a voltage v_out. This voltage is provided to a block 140, which performs signal equalization, clock data recovery, signal decoding, and other processing.

FIG. 2 illustrates a typical TIA 110. TIA core stage 110c converts the input current i_in into a voltage v1. This voltage is amplified by a variable-gain stage 110v, whose output voltage v2 is buffered by buffer 110b to produce the voltage v_out.

SUMMARY

This section summarizes some features of the invention. Other features may be described in the subsequent sections. The invention is defined by the appended claims, which are incorporated into this section by reference.

Some embodiments of the present invention provide amplifiers with programmable features such as bandwidth (BW) or peaking. In some embodiments, programmability is achieved without significant increase in parasitics (parasitics are parasitic capacitances or inductances or other parameters that negatively affect amplifier performance). Therefore, high data rates can be provided.

The invention is not limited to the features or advantages described above except as defined by the appended claims.

BRIEF DESCRIPTION OF THE DRAWINGS

FIGS. 1 and 2 illustrate exemplary optical communication systems with amplifiers.

FIGS. 3A and 3B are block diagrams of exemplary amplifier stages.

DESCRIPTION OF SOME EMBODIMENTS

Figures 4, 5:
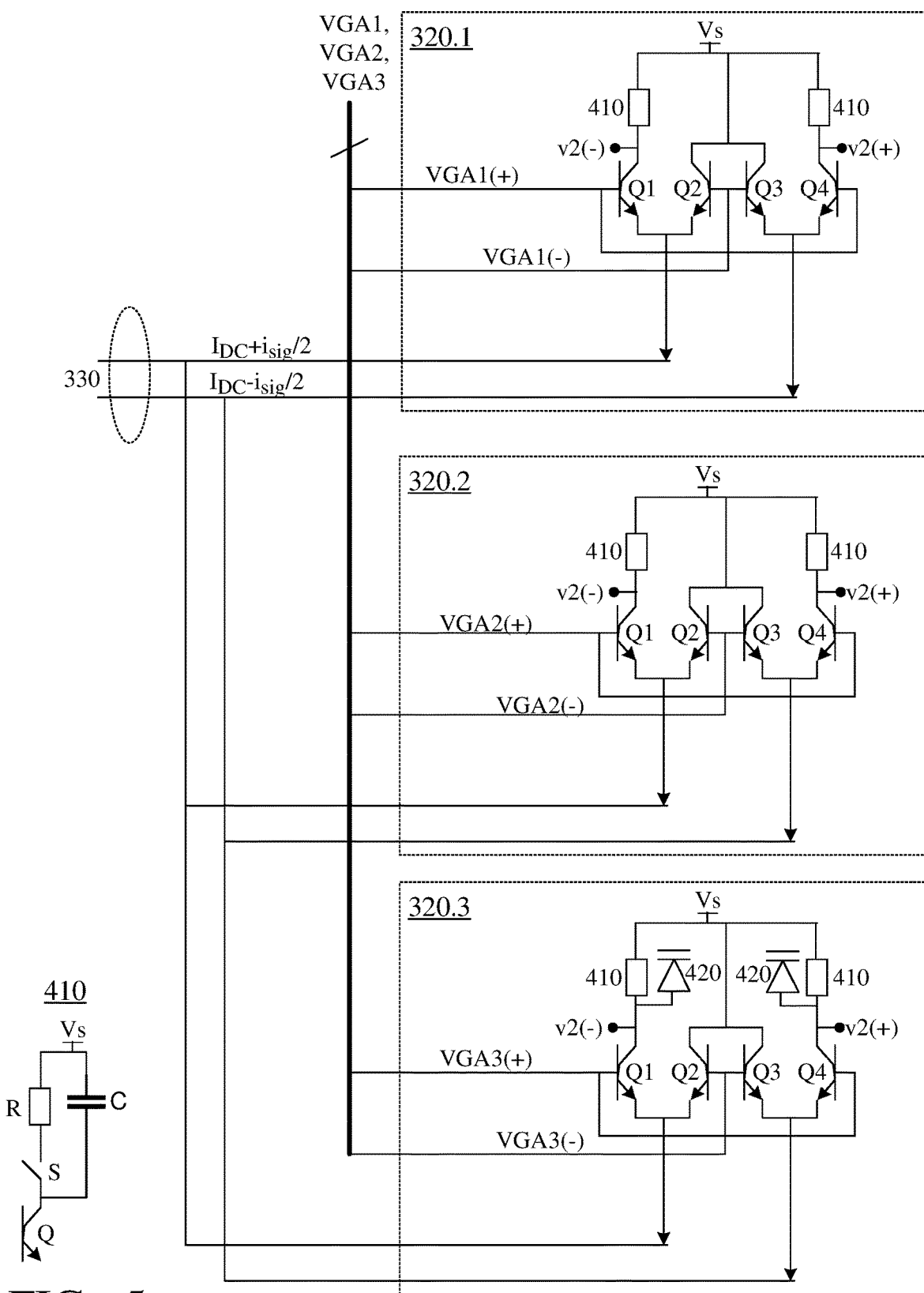
FIG. 4 is a circuit diagram of an exemplary amplifier stage.
FIG. 5 is an exemplary programmable circuit in an exemplary amplifier stage.

The embodiments described in this section illustrate but do not limit the invention. The invention is defined by the appended claims.

Some aspects of the present invention will now be illustrated on an example transimpedance amplifier for an RF (radio frequency) receiver for digital communications. The amplifier has a programmable bandwidth that can be programmed for ultrahigh data rates, e.g. 64 GB/s or higher. The amplifier bandwidth (BW) can be 40 GHz or higher. The amplifier can also be programmed for lower bandwidth to reduce the amplifier-generated noise.

In conventional ultrahigh data rate TIAs, programmable RF functionality (e.g. BW or peaking programmability) is avoided because it involves increased parasitics on the critical nodes and hence degradation of RF performance. The RF chain design is therefore simple and minimal.

The inventors have discovered ways to provide a programmable TIA without significant increase in parasitics. In some examples, an increase in parasitics is limited to low impedance nodes, and hence does not have a significant effect on high frequency operation.

In some embodiments, at least some of programmability is achieved by providing multiple RF signal paths from the amplifier input (i_in) to the output (v_out). Different paths are associated with respective different electrical parameters such as bandwidth. The amplifier is programmed by selecting one of the paths while disabling the others. The paths branch out at a low impedance node or nodes.

In one example, the paths branch out inside VGA stage 110v. FIG. 3A shows an example VGA stage including a cascode amplifier. The cascode amplifier has a common-emitter amplifier 310 feeding a common base amplifier 320 (amplifier 320 has a variable gain, controlled by a signal "VGA"). CB amplifier 320 offers low AC impedance to CE amplifier 310—the output AC current of CE amplifier 320, at the node 330 between amplifiers 310 and 320, does not have a high impact on the AC voltage at node 330. Therefore, the node 330 capacitance can be increased without a large impact on the overall performance.

Hence, in some embodiments (FIG. 3B), multiple signal paths are provided, and are arranged to branch out at node 330. FIG. 3B shows three paths, including respective amplifiers 320.1, 320.2, 320.3 in lieu of amplifier 320 of FIG. 3A. Any number of paths may be provided. Different paths may differ in bandwidth or other parameters. One of the paths can be selected, and can be enabled while disabling the other paths, e.g. by using the VGA signal to set a zero gain in the deselected paths while setting a non-zero gain in the selected path. The VGA signal is generated by a controller 340. For example, the VGA signal can be permanently hardwired at manufacturing time to select a signal path, or can be selected based on other criteria, e.g. a detected data rate of photodetector 120. Also, the VGA signal may control the gain of stage 110v using known techniques. The VGA signal can be replaced by another signal unrelated to the gain control function.

Each amplifier 320.i (i=1, 2, 3) has a v2 output fed into buffer stage 140b. Buffer stage 140b may or may not have a separate buffer for each path. Different paths may be merged at any desired point, e.g. at the v_out output. For example, in some embodiments, each path has a separate buffer 140b including an emitter follower (not shown) receiving the respective v2 voltage and providing an output voltage to a respective common emitter amplifier (not shown). The common emitter amplifiers of different paths provide the voltage v_out on an output node shared by the paths.

Another programmability technique used in some embodiments relates to a programmable transition speed within each stage 320 (FIG. 3A) or 320.i (FIG. 3B). As is known, the amplifier speed can be adjusted by a switched capacitor or a peaking inductance. Some embodiments use a varactor to reduce the associated parasitics, as discussed below in connection with FIG. 4.

FIG. 4 is an example circuit diagram of blocks 320.1, 320.2, 320.3. Each block is a common-base differential amplifier, with bipolar transistors Q1, Q2, Q3, Q4 whose emitters are coupled to differential input terminal 330 receiving a differential current signal $I_{DC}+i_{sig}/2$, $I_{DC}-i_{sig}/2$ from CE amplifier 310. Specifically, in each block 320.i, the Q1 and Q2 emitters receive $I_{DC}+i_{sig}/2$, and the Q3 and Q4 emitters receive $I_{DC}-i_{sig}/2$. The collectors of transistors Q1 and Q4 provide the respective output voltages v2(−) and v2(+) when the respective block 320.i is selected by the VGA signal.

The VGA signal includes differential voltages VGA1, VGA2, VGA3, provided to respective blocks 320.1, 320.2, 320.3. Each signal VGAi includes a positive component voltage VGAi(+) provided to the base terminals of transistors Q1 and Q4 of the respective block 320.i, and includes a negative component voltage VGAi(−) provided to the base terminals of transistors Q2 and Q3. If the block 320.i is disabled, the positive and negative components VGAi are at some low voltage (possibly ground) to keep the block's transistors Q1 through Q4 off. If the block is enabled, the signal VGAi is used to control the block's gain; the positive and negative components are at some voltages VGAi(+) =$U_{iCM}$+$U_i$/2, VGAi(−)=$U_{iCM}$−$U_i$/2, where $U_{iCM}$ and $U_i$/2 are the respective DC and AC voltages selected to provide a desired gain while keeping the transistors Q1 through Q4 in the active region. Automatic gain control can be used in some embodiments.

In each block 320.i, the collectors of transistors Q2, Q3 are coupled to a power supply terminal Vs. The Vs voltages may or may not be the same in different blocks 320.i. In each of transistors Q1 and Q4, the collector is coupled to Vs through a respective device 410, which may be a resistor, or a resistor in parallel with a capacitor, or some other resistor/capacitor network to obtain desired bandwidth. Other devices, e.g. inductors, diodes, or transistors, can also be used in device 410.

In the example of FIG. 5, the device 410 includes a resistor R coupled to the Vs terminal, a switch S coupled to the resistor R and to the collector of transistor Q (one of Q1 and Q4), and a capacitor C coupled to the collector and the Vs terminal. This "switched capacitor" arrangement provides additional bandwidth programming capability through control of switch S. In particular, the collector voltage transitions are subject to the RC delay of resistor R and capacitor C. The RC delay is smaller when the switch S is open. Therefore, the maximum collector voltage transition speed, and hence the bandwidth, can be programmed by programming the open and closed times of the switch S. This programming can be done using known techniques, e.g. using a programmable clock (not shown) that opens and closes the switch at programmed times.

Within each block 320.i, the two devices 410 may or may not be identical. The devices 410 may or may not be identical in different blocks 320.i.

Block 320.3 includes, for each of transistors Q1 and Q4, a varactor 420 having an anode coupled to the transistor's collector and having a cathode coupled to an appropriate control voltage. The varactor lowers the block 320.3 speed and hence the bandwidth. The varactor thus provides additional bandwidth programmability. The bandwidth is programmed by the control voltage, as the varactor's capacitance depends on the voltage across the varactor.

The varactor is superior to a switched capacitor arrangement of FIG. 5 due to lower parasitics associated with the varactor when path 320.3 is in the off state (i.e. deselected), because the parasitic capacitance of switch S in the switch capacitor arrangement would keep the switch open always for very high frequencies.

The invention is not limited to the embodiments described above. Some embodiments have only one signal path, as in FIG. 3A; additional programmability is provided by a varactor as in path 320.3 of FIG. 4. Additional devices can be provided between the collectors of one or both of Q2 and Q3. PNP transistors can be used with, or instead of, NPN transistors. Also, bipolar circuits can be replaced by FET circuits, with the FET transistors Q1 through Q4 operating in the linear region. In particular, one or more of common base amplifiers 320, 320.i can be replaced by common gate amplifiers or some other types. Common emitter amplifier 310 can be replaced by a common source amplifier or some other type. Differential signals can be replaced by single-ended signals. Different amplifier types can be used in different signal paths in the same TIA 110.

Other embodiments and variations are within the scope of the invention, as defined by the appended claims.

The invention claimed is:

1. A programmable amplifier comprising:
   a first circuit for receiving an input signal and generating in response, on a first node, a first current signal responsive to the input signal;
   a plurality of signal paths coupled to the first node, for generating a second signal responsive to the first current signal, each signal path comprising one or more transistors each of which has:
   a first terminal coupled to receive the first current signal from the first node,
   a second terminal, and
   a control terminal coupled to receive a path selection signal for enabling one of the signal paths while disabling every other signal path;
   wherein each signal path comprises a buffer coupled to amplify a signal on at least one second terminal of the signal path to generate the second signal when the signal path is enabled, each buffer having an output terminal, the output terminals of the buffers being coupled to an output of the programmable amplifier, the output of the programmable amplifier being shared by the signal paths.

2. The programmable amplifier of claim 1, wherein the path selection signal is configured to control a gain of the enabled signal path.

3. The programmable amplifier of claim 1, wherein at least one signal path comprises a respective common base amplifier comprising said one or more transistors of the signal path.

4. The programmable amplifier of claim 3, wherein the common base amplifier is a differential amplifier, and the first current signal is a differential signal.

5. The programmable amplifier of claim 3, wherein the first circuit comprises a common emitter amplifier for generating said first current signal.

6. The programmable amplifier of claim 1, wherein at least one signal path comprises a respective common gate amplifier comprising said one or more transistors of the signal path.

7. The programmable amplifier of claim 6, wherein the common gate amplifier is a differential amplifier, and the first current signal is a differential signal.

8. The programmable amplifier of claim 6, wherein the first circuit comprises a common source amplifier generating said first current signal.

9. The programmable amplifier of claim 1, wherein the programmable amplifier comprises a transimpedance amplifier.

10. The programmable amplifier of claim 1, wherein in each signal path, at least one said transistor's second terminal is coupled to a varactor circuit to provide one or both of a programmable bandwidth and a programmable peaking for the signal path.

11. The programmable amplifier of claim 1, wherein at least two of the signal paths differ in bandwidth, and the path selection signal selects a bandwidth of the programmable amplifier by selecting the signal path.

12. The programmable amplifier of claim 1, wherein at least two of the signal paths differ in peaking, and the path selection signal selects peaking of the programmable amplifier by selecting the signal path.

13. The programmable amplifier of claim 1, wherein the path selection signal is permanently hardwired to select one of the signal paths.

14. The programmable amplifier of claim 1, wherein each signal path comprises a respective common base amplifier comprising said one or more transistors of the signal path.

15. The programmable amplifier of claim 14, wherein:
at least two of the signal paths differ in bandwidth and/or peaking, and the path selection signal selects the bandwidth and/or peaking of the programmable amplifier by selecting the signal path.

16. A method for operating a programmable amplifier, the method comprising:
receiving an input signal by a first circuit of the programmable amplifier, and generating in response, on a first node, a first current signal responsive to the input signal;
providing the first current signal to each of a plurality of signal paths coupled to the first node, each signal path being operable, when enabled by a path selection signal, to generate a second signal responsive to the first current signal, each signal path comprising one or more transistors each of which has:
a first terminal coupled to receive the first current signal from the first node,
a second terminal, and
a control terminal receiving a path selection signal operable to enable or disable the signal path;
providing the path selection signal to each said control terminal, the path selection signal enabling one of the signal paths and disabling every other signal path; and
generating the second signal by the enabled signal path;
wherein each signal path comprises a buffer coupled to amplify a signal on at least one second terminal of the signal path, each buffer having an output terminal to provide the second signal when the signal path is enabled, the output terminals of the buffers being coupled to an output of the programmable amplifier, the output of the programmable amplifier being shared by the signal paths; and
the method further comprises amplifying the second signal by the buffer of the enabled signal path and providing the amplified second signal at the output of the programmable amplifier.

17. The method of claim 16, wherein the path selection signal controls a gain of the enabled signal path.

18. The method of claim 16, wherein at least two of the signal paths differ in bandwidth, and the path selection signal selects a bandwidth of the programmable amplifier by selecting the signal path.

19. The method of claim 16, wherein at least two of the signal paths differ in peaking, and the path selection signal selects peaking of the programmable amplifier by selecting the signal path.

20. The method of claim 16, wherein the path selection signal is permanently hardwired to select one of the signal paths.

* * * * *